United States Patent
Murali (10) Patent No.: US 6,869,882 B2
(45) Date of Patent: Mar. 22, 2005

(54) METHOD OF CREATING A PHOTONIC VIA USING DEPOSITION

(75) Inventor: Venkatesan Murali, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/741,532

(22) Filed: Dec. 19, 2000

(65) Prior Publication Data

US 2005/0032384 A1 Feb. 10, 2005

(51) Int. Cl.⁷ ............................................. H01L 21/311
(52) U.S. Cl. ...................................... 438/700; 438/702
(58) Field of Search ................................. 438/689, 690, 438/691, 692, 693, 694, 700, 702, 706, 719

(56) References Cited

U.S. PATENT DOCUMENTS

| | | | |
|---|---|---|---|
| 4,879,318 A | * 11/1989 | Lipscomb et al. | ....... 425/174.4 |
| 4,989,934 A | 2/1991 | Zavracky et al. | |
| 5,169,188 A | * 12/1992 | Kupperman et al. | ..... 292/307 R |
| 5,346,583 A | 9/1994 | Basavanhally | |
| 5,400,419 A | 3/1995 | Heinen | |
| 5,416,870 A | 5/1995 | Chun et al. | |
| 5,604,835 A | * 2/1997 | Nakamura et al. | .......... 385/129 |
| 5,659,640 A | 8/1997 | Joyner | |
| 5,721,797 A | 2/1998 | Basavanhally et al. | |
| 5,764,832 A | 6/1998 | Tabuchi | |
| 5,790,583 A | * 8/1998 | Ho | .............................. 372/108 |
| 5,878,070 A | * 3/1999 | Ho et al. | ..................... 372/108 |
| 6,301,401 B1 | 10/2001 | La | |
| 6,311,004 B1 | * 10/2001 | Kenney et al. | ............. 385/130 |
| 6,330,377 B1 | * 12/2001 | Kosemura | .................... 385/14 |

* cited by examiner

Primary Examiner—Kin-Chan Chen
(74) Attorney, Agent, or Firm—Kevin A. Reif (57) ABSTRACT

A photonic via is made in a substrate by making a hole in the substrate, depositing a cladding into the hole, and then depositing an optical core material into the hole. In one embodiment, a lens can be made by applying a polymer on top of the photonic via and curing.

7 Claims, 8 Drawing Sheets

METHOD OF CREATING A PHOTONIC VIA USING DEPOSITION

BACKGROUND OF THE INVENTION

1. Field of the Invention

The described invention relates to the field of optic integrated circuits. In particular, the invention relates to a method of forming a photonic via through a substrate.

2. Description of Related Art

Electronic components are placed on a shared substrate in multi-chip modules ("MCM"). By packing a number of semiconductor devices in close proximity to each other, this eliminates the need for individual packages for each of the devices. Electrical performance is improved, and board space and cost are reduced.

In a conventional MCM, the devices are connected to a substrate and the electrical connection among the devices is accomplished within the substrate, which may also be an integral part of the MCM package. One of the technologies used to connect the devices to the substrate is called flip chip or control collapse chip connection ("C4"). With this technology, solder bumps are reflowed to make connection to the terminal pads on the substrate.

Photonic components, such as, but not limited to, array waveguides, amplifiers, couplers, splitters, and other devices for carrying light-based ("photonic") signals are manufactured using a different process than that for semiconductors. Thus, components and photonic components are manufactured on separate substrates using different processes and then interfaced together.

DETAILED DESCRIPTION

Figure 1:
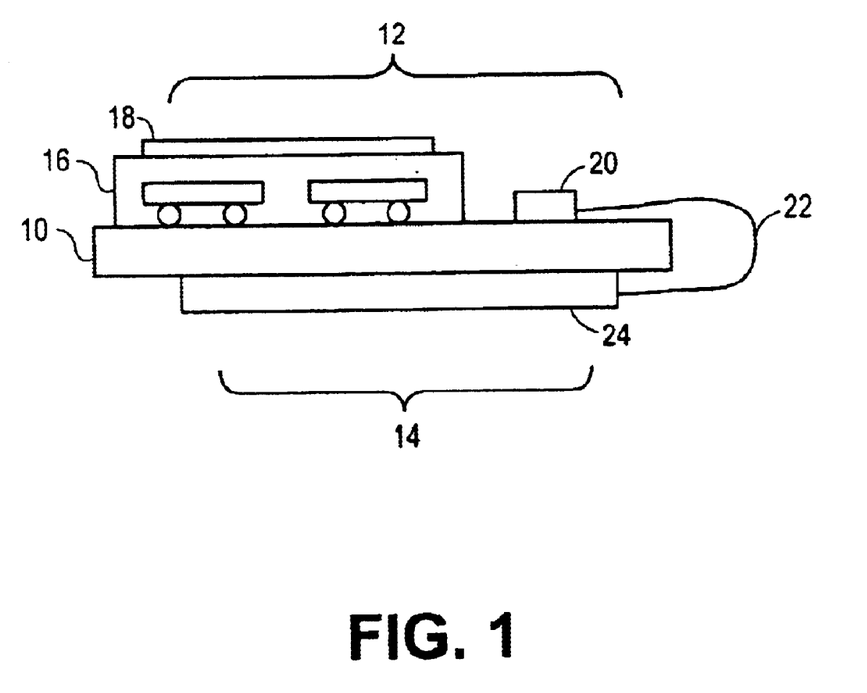
FIG. 1 shows a representation of a substrate having both electronic and photonic components.

FIG. 1 shows a representation of a substrate 10 having both electronic 12 and photonic 14 components. In one embodiment, the electronic components 12 include a light source for generating a photonic signal from an electrical input. The photonic signal is transmitted to the photonic components 14 on the other side of the substrate 10. In one embodiment, a housing 16 may be used to cover one or more of the electronic components, the photonic components and/or the substrate. A heat sink 18 may be used to help cool the components.

In one embodiment, a light source such as an edge emitting laser (EEL) 20 is used to produce a photonic signal. The EEL may be coupled via a fiber optic 22 (also called an "optical fiber") around the substrate 10 to a waveguide 24 or other photonic component on the other side of the substrate 10.

Figure 2:
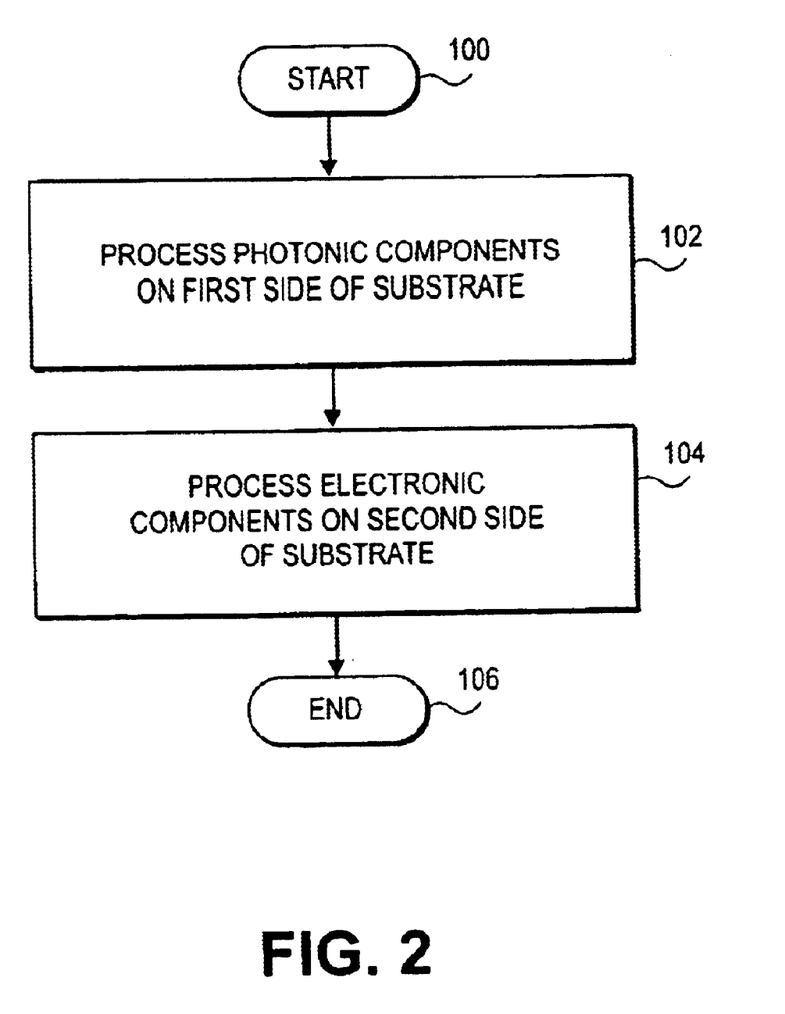
FIG. 2 is a flowchart illustrating the process for making a substrate with both electronic and photonic components.

FIG. 2 is a flowchart illustrating the process for making a substrate with both electronic and photonic components. Because the photonic components require elevated temperatures of up to 900–1000 degrees C., the photonic side is processed first (box 102). It should be noted that standard semiconductor processes go up to approximately 230 degrees C., above which insulative and passivafion layers comprising, e.g, polyimide, may be damaged.

Processing of the photonic components may include creating a waveguide, which is described in more detail with respect to FIGS. 7A–7C and 8A–8E. After the photonic components are processed, the electronic interconnections are made on the substrate (box 104). Electronic components are attached to the substrate through solder and flip chip (C4) solder bumps.

Figure 3:
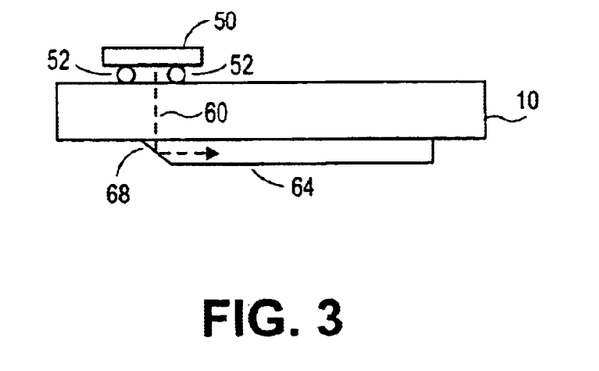
FIG. 3 shows a light source such as a vertical cavity surface emitting laser (VCSEL) mounted to a substrate and employed to provide a photonic signal.

FIG. 3 shows a light source such as a vertical cavity surface emitting laser (VCSEL) 50 mounted to a substrate 10 and employed to provide a photonic signal 60. The VCSEL 50 produces a vertical cone of light. In one embodiment, the VCSEL is mounted on one side of the substrate using the flip chip (or C4) technology employing solder bumps. The VCSEL 50 is lithographically aligned on the substrate to provide a photonic signal 60 through the substrate to a photonic component such as a waveguide 64 on the other side of the substrate.

In one embodiment, an angled surface 68 is used to re-direct the photonic signal 60 from the VCSEL 50 through the waveguide 64 by reflecting the photonic signal approximately 90 degrees. In this embodiment, the angled surface makes an approximate 45 degree angle with the surface of the substrate and is part of the waveguide itself. A method for making the angled surface in the waveguide is described with respect to FIGS. 7A–7C and 8A–8E.

A "photonic via" is employed to couple the light source with the photonic component on the other side of the substrate. In one embodiment, reactive ion etching ("RIE") is used to make a hole in the substrate. RIE allows for anisotropic vertical etching. In the simplest embodiment, an air-filled photonic via couples the light source with the photonic component. However, photonic vias can also be made out of standard optical materials including, but not limited to, glass, oxides, and polymers.

Figure 4:
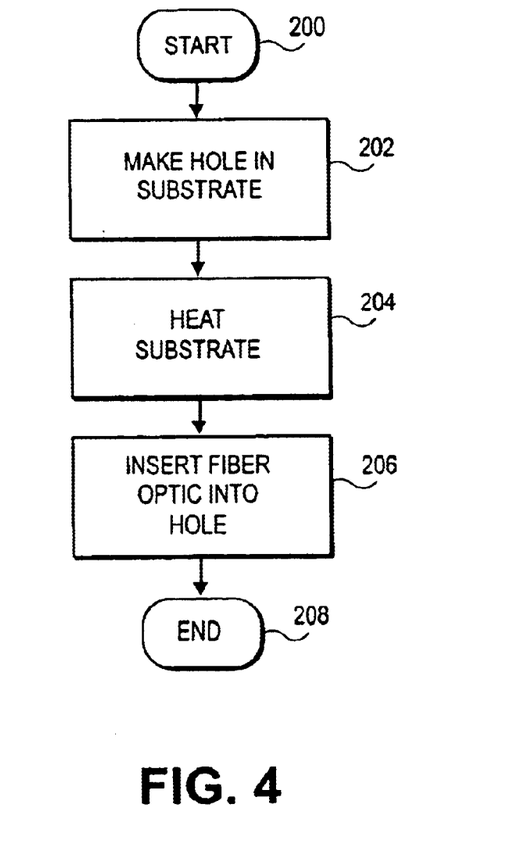
FIG. 4 shows a method of making a photonic via comprising a fiber optic.

FIG. 4 shows a method of making a photonic via comprising a fiber optic. In one embodiment, a hole is made in a substrate using an etch or other method (box 202), then the substrate is heated (box 204). The hole expands due to the temperature, and a fiber optic is then inserted into the hole (box 206). When the substrate cools back to room temperature and the hole shrinks, the fiber optic is held firmly in place. In one embodiment, the substrate is heated to approximately 150–200 degrees C., but the temperature depends on the coefficient of thermal expansion of the substrate and also depends on how well the fiber optic is held in place after the substrate cools down.

Figure 5:
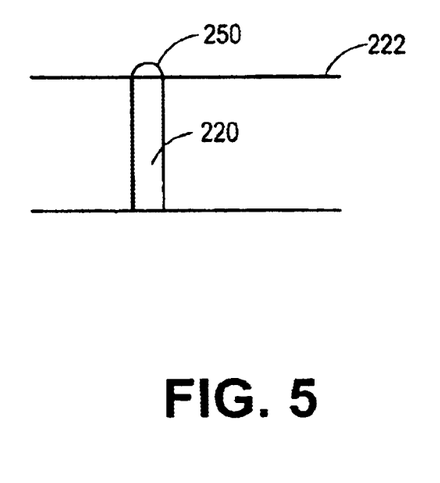
FIG. 5 shows a cross section of a fiber optic inserted into the substrate as described with respect to FIG. 4.

FIG. 5 shows a cross section of a fiber optic 220 inserted into the substrate 222 as described with respect to FIG. 4. After the fiber optic 220 is inserted into the substrate, the end of the fiber optic 220 may be polished to provide a better optical coupling. A lens 250 can be added as will be described later.

Figure 6A:
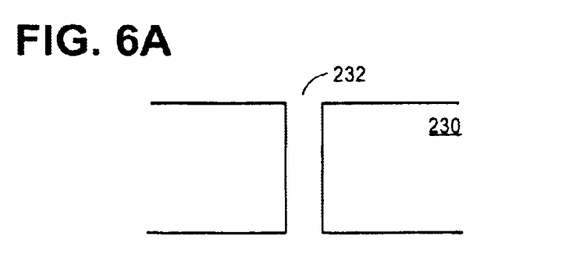
FIGS. 6A–6D show, in cross-section, an embodiment for making a photonic via using deposition.
Figure 6B:
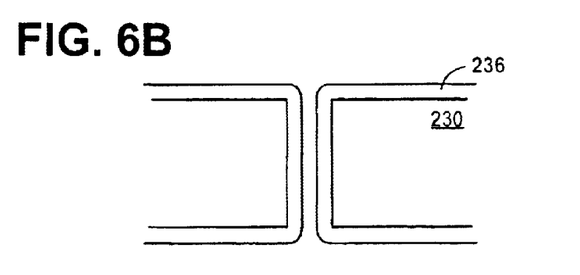
Figure 6C:
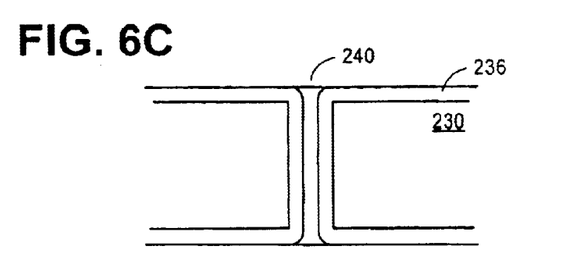
Figure 6D:
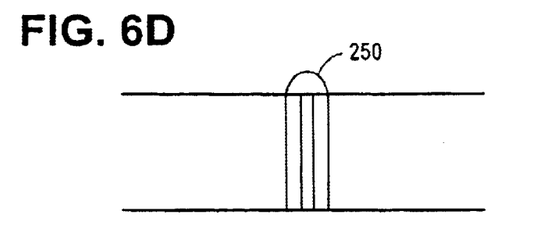

FIGS. 6A–6D show, in cross-section, an embodiment for making a photonic via using deposition. In FIG. 6A, a hole or trench 232 is made in the substrate 230. RIE may be used to make the hole, as previously described. A cladding 236 is then deposited as shown in FIG. 6B. In one embodiment, the cladding material is an oxide that is evenly deposited over the entire substrate to a predetermined thickness using chemical vapor deposition (CVD). An optical core material 240 having a higher index of refraction than the cladding material is then deposited and fills the rest of the hole, as shown in FIG. 6C. In one embodiment, the optical core material is a polymer, but oxides may be employed also. A polishing step can be applied to provide a better optical coupling for the photonic via. Polishing may also be used to eliminate the cladding from the surfaces of the substrate as shown in FIG. 6D.

Additionally, the technique of FIGS. 6A–6D may be employed to not only couple components on opposite sides of a substrate but to couple photonic components, one or both of which may be internal to the substrate.

A further enhancement to the fiber optic photonic via and the deposition photonic via of FIGS. 4, 5 and 6A–6C is to form a-lens to better direct light into the photonic via. One method of forming a lens is to apply polymer to the end of the photonic via. As the polymer is cured, a lens 250 is formed, as shown in FIGS. 5 and 6D. By modifying the amount of material used in the lens and the cure time, different shapes may be produced.

In one embodiment, a light source such as a VCSEL having a wavelength of approximately 1550 nm is used to provide a photonic signal through a silicon substrate. Silicon is transparent to light having a wavelength of approximately 1550 nm, so no physical via is needed. The "photonic via" in this case is directly through the solid silicon substrate.

Figure 7A:
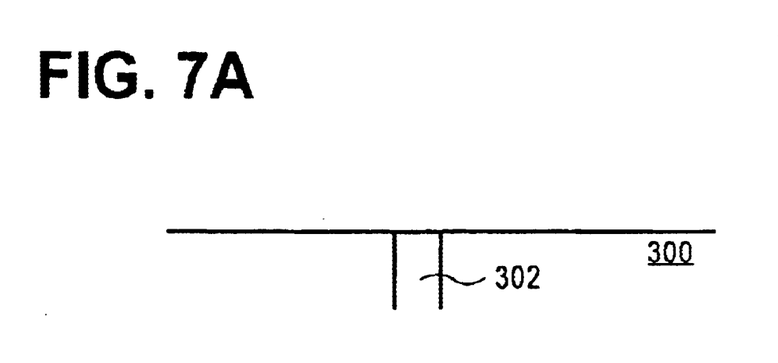
FIGS. 7A–7C show, in cross-section, a first embodiment for making a waveguide having an angled surface for redirecting a photonic signal.
Figure 7B:
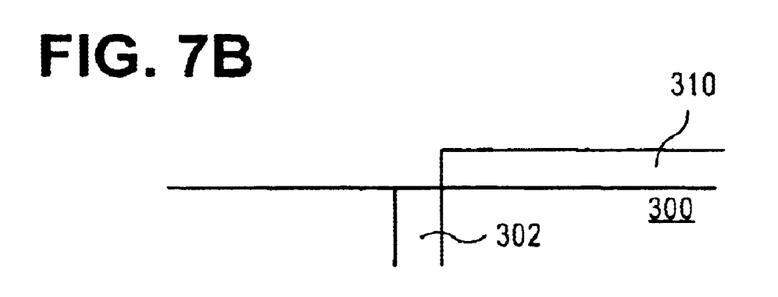
Figure 7C:
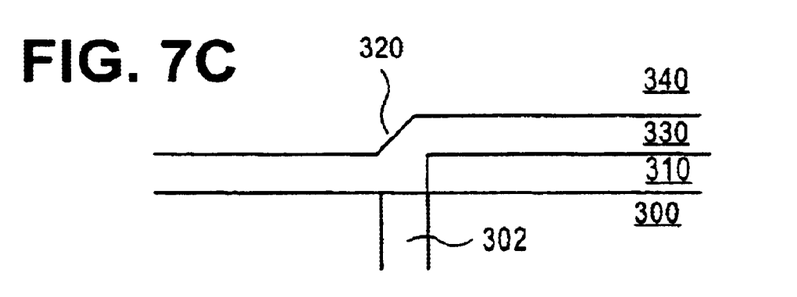

FIGS. 7A–7C show, in cross-section, a first embodiment for making a waveguide having an angled surface for redirecting a photonic signal. FIG. 7A shows a photonic via 302 in a substrate 300. The photonic via may be made by one of the methods previously described.

FIG. 7B shows a layer of cladding 310 that is deposited on the substrate 300. In one embodiment, the cladding is $SiO_2$ that is thermally grown on the substrate 300 and then etched to be lithographically aligned to the edge of the photonic via 302. Alternatively, the cladding 310 could be formed by other methods of deposition and etching.

FIG. 7C shows a layer of optical core material 330 deposited over the cladding 310 and the substrate 300. In one embodiment, the optical core material 330 is deposited by high density plasma (HDP) deposition. Due to the different heights of the substrate 300 and the cladding 310, the optical core material 330 forms an angled surface 320 that makes an approximate 45 degree angle with the substrate surface. In one embodiment the optical core material 330 is glass, but it could alternatively be a polymer or other material. The optical core material 330 also forms a waveguide by trapping light that enters the section between the cladding 310 and the outside air 340. In one embodiment, the optical core material of the angled surface and waveguide is either of the same material as that of the photonic via or has a similar index of refraction.

Figure 8A:
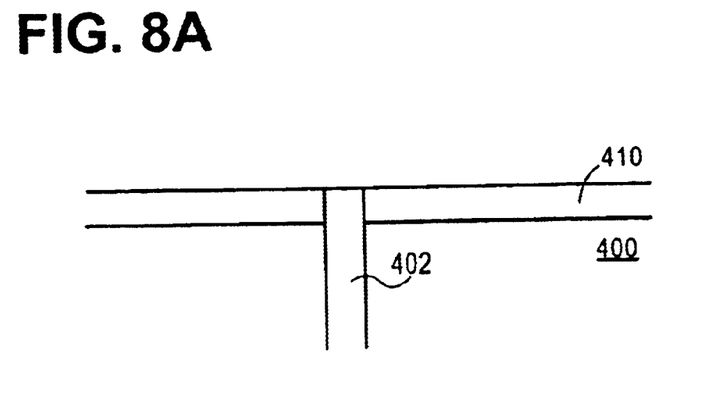
FIGS. 8A–8E show, in cross-section, a second embodiment for making a waveguide having an angled surface for redirecting a photonic signal.
Figure 8B:
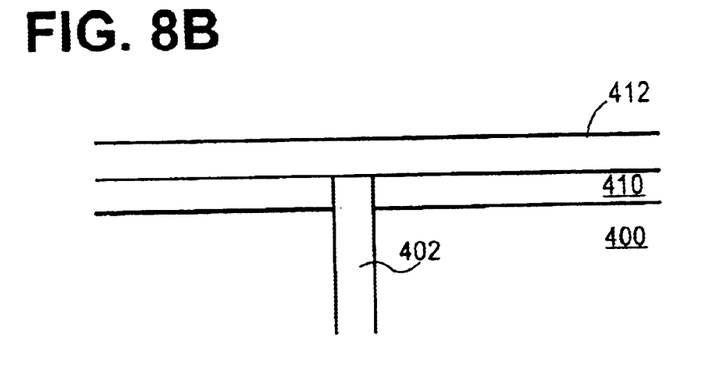
Figure 8C:
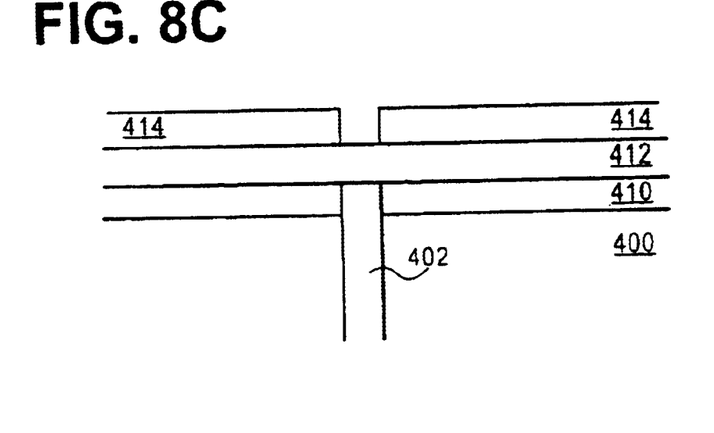

FIGS. 8A–8E show, in cross-section, a second embodiment for making a waveguide having an angled surface for redirecting a photonic signal. FIG. 8A shows a substrate 400 with a cladding 410 deposited on it. A photonic via 402 goes through the substrate 400 and the cladding 410. FIG. 8B shows a layer of optical core material 412 deposited onto the cladding 410 and photonic via 402. A mask 414 is then deposited on top of the optical core material 412, as shown in FIG. 8C. In one embodiment the mask comprises silicon nitride, but other materials may also be used.

Figure 8D:
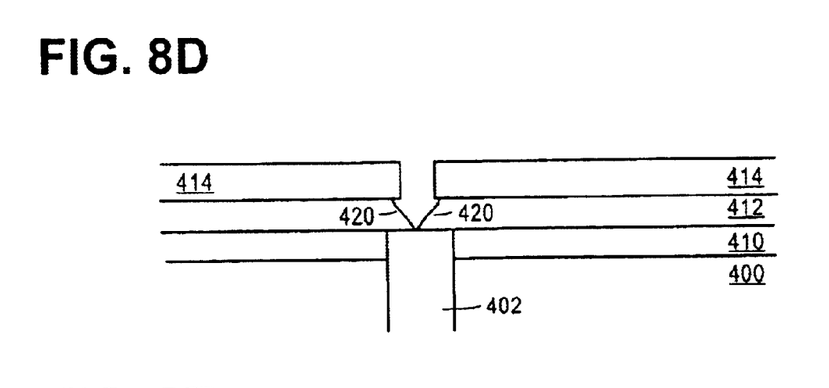
Figure 8E:
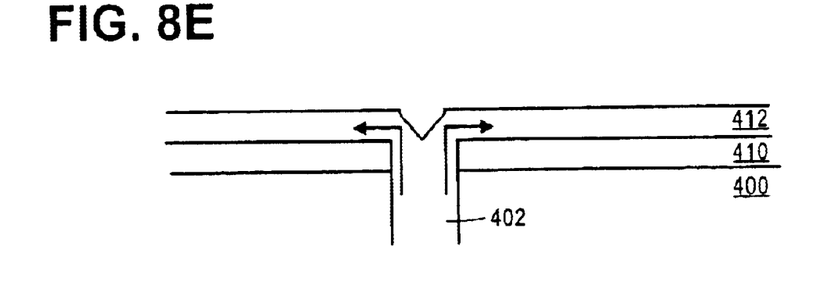

FIG. 8D shows the waveguide after an etch is applied which causes the optical core material to form an angled surface 420. In one embodiment, a wet isotropic etch is employed; however, an isotropic dry etch may alternatively be employed. The mask can then be stripped off using another etch, as shown in FIG. 8E. Because of the dual masks 414, two waveguides each with its own angled surface is achieved. Of course making a single waveguide and a single angled surface is also easily achieved by modifying the mask layer.

The angled surfaces of FIGS. 7A–7C and 8A–8E are able to redirect photonic signals from the photonic via into the waveguide, as was described with respect to FIG. 3. By lithographically aligning a light source with the waveguide, much time is saved and efficiency is improved from manual alignment.

Thus, a method of creating a photonic via using deposition is disclosed. However, the specific embodiments and methods described herein are merely illustrative. Numerous modifications in form and detail may be made without departing from the scope of the invention as claimed below. The invention is limited only by the scope of the appended claims.

What is claimed is:

1. A method of making a photonic via comprising:
    making a hole in a substrate, wherein the hole extends from one side of the substrate through the substrate to an opposite side of the substrate;
    heating the substrate to expand the hole;
    inserting a fiber optic into the hole;
    cooling the substrate to contract the hole to hold the fiber optic in place;
    polishing the substrate;
    applying a polymer on top of the fiber optic; and
    curing the polymer to form a lens.

2. The method of claim 1 wherein the heating temperature is dependent on the coefficient of thermal expansion of the substrate.

3. The method of claim 2 further comprising heating the substrate to approximately 150–200 degrees C.

4. The method of claim 1, further comprising:
    forming a waveguide having an angled surface to redirect light in a direction substantially perpendicular to the fiber optic, comprising:
        depositing a cladding layer over a surface of the substrate;
        etching to align the cladding layer with one side of the hole on the substrate;
        depositing a layer of optical material over the cladding and the substrate wherein a difference in height between the cladding and the substrate causes the optical material to form a surface having approximately a 45 degree angle over the hole.

5. The method as recited in claim 4 wherein the optical material comprises glass.

6. A method of making a photonic via comprising:
    making a hole in a substrate, wherein the hole extends from one side of the substrate through the substrate to an opposite side of the substrate;
    heating the substrate to expand the hole;
    inserting a fiber optic into the hole;

cooling the substrate to contract the hole to hold the fiber optic in place;

polishing the substrate; and forming a waveguide having an angled surface to redirect light in a direction substantially perpendicular to the fiber optic, comprising:
  depositing a cladding layer on the substrate;
  depositing a layer of optical material over the cladding;
  depositing a mask on the optical material with an opening over the hole; and
  etching to form at least one angled surface in the optical material.

7. The method as recited in claim 6 further comprising:
etching to form two angled surfaces in the optical material.

* * * * *

UNITED STATES PATENT AND TRADEMARK OFFICE
CERTIFICATE OF CORRECTION

PATENT NO. : 6,869,882 B2
DATED : March 22, 2005
INVENTOR(S) : Murali

It is certified that error appears in the above-identified patent and that said Letters Patent is hereby corrected as shown below:

<u>Column 1,</u>
Line 30, after "Thus,", insert -- electronic --.

<u>Column 2,</u>
Line 10, delete "900-1000" and insert -- 900-1100 --.
Line 13, delete "passivafion" and insert -- passivation --.

Signed and Sealed this

Twenty-eighth Day of June, 2005

JON W. DUDAS
*Director of the United States Patent and Trademark Office*